(12) United States Patent
Caplan et al.

(10) Patent No.: US 7,750,695 B2
(45) Date of Patent: Jul. 6, 2010

(54) PHASE-LOCKED LOOP CIRCUITRY USING CHARGE PUMPS WITH CURRENT MIRROR CIRCUITRY

(75) Inventors: Randy J. Caplan, Hoschton, GA (US); Steven P. Hardy, Chula Vista, CA (US); Andrew Cole, Sunnyvale, CA (US)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 0 days.

(21) Appl. No.: 11/264,283

(22) Filed: Oct. 31, 2005

(65) Prior Publication Data

US 2006/0125535 A1 Jun. 15, 2006

Related U.S. Application Data

(60) Provisional application No. 60/635,849, filed on Dec. 13, 2004.

(51) Int. Cl.
  *H03L 7/06* (2006.01)
(52) U.S. Cl. .................................. 327/148; 327/157
(58) Field of Classification Search ................. 327/148, 327/157
  See application file for complete search history.

(56) References Cited

U.S. PATENT DOCUMENTS

| | | | |
|---|---|---|---|
| 5,233,314 A | | 8/1993 | McDermott et al. |
| 5,362,990 A | * | 11/1994 | Alvarez et al. ............ 327/538 |
| 5,404,250 A | | 4/1995 | Hase et al. |
| 5,473,283 A | | 12/1995 | Luich |
| 5,508,660 A | * | 4/1996 | Gersbach et al. ............ 331/17 |
| 5,561,400 A | * | 10/1996 | Iguchi et al. ............... 331/163 |
| 5,783,972 A | | 7/1998 | Nishikawa |
| 5,933,037 A | | 8/1999 | Momtaz |
| 5,945,855 A | | 8/1999 | Momtaz |

(Continued)

FOREIGN PATENT DOCUMENTS

EP  0405523 A2  1/1991

(Continued)

OTHER PUBLICATIONS

Samavati, et al., A Fully-Integrated 5 GHz CMOS Wireless-LAN Receiver, IEEE International Solid-State Circuits Conference, 2001.

(Continued)

*Primary Examiner*—Lincoln Donovan
*Assistant Examiner*—Ryan C Jager
(74) *Attorney, Agent, or Firm*—Hamilton, Brook, Smith and Reynolds, P.C.

(57) ABSTRACT

A system and method for performing phase-locked loop is disclosed. The system includes phase frequency detector circuitry, charge pump circuitry having first current mirror circuitry and second current mirror circuitry, loop filter circuitry, and voltage controlled oscillator circuitry. The phase frequency detector circuitry generates an up signal and a down signal based on the phase difference of an input signal and a feedback signal. The charge pump circuitry includes the first current mirror circuitry and the second mirror circuitry and generates a charge pump output signal based on the up and down signals. The loop filter circuitry generates a filtered control signal based on the charge pump output signal. The voltage controlled oscillator circuitry generates the feedback signal with a repeating waveform based on the filtered control signal.

28 Claims, 8 Drawing Sheets

U.S. PATENT DOCUMENTS

| | | | |
|---|---|---|---|
| 6,124,755 A * | 9/2000 | Parker et al. | 327/543 |
| 6,160,432 A * | 12/2000 | Rhee et al. | 327/157 |
| 6,163,184 A | 12/2000 | Larsson | |
| 6,198,266 B1 * | 3/2001 | Mercer | 323/316 |
| 6,229,362 B1 | 5/2001 | Choi | |
| 6,278,332 B1 | 8/2001 | Nelson et al. | |
| 6,316,987 B1 | 11/2001 | Dally et al. | |
| 6,336,354 B1 * | 1/2002 | Suzuki et al. | 73/31.05 |
| 6,512,404 B2 | 1/2003 | Ruegg et al. | |
| 6,535,051 B2 | 3/2003 | Kim | |
| 6,603,340 B2 | 8/2003 | Tachimori | |
| 6,617,936 B2 | 9/2003 | Dally et al. | |
| 6,636,098 B1 | 10/2003 | Kizer | |
| 6,664,829 B1 | 12/2003 | Hughes | |
| 6,667,641 B1 | 12/2003 | Wang et al. | |
| 6,710,665 B2 | 3/2004 | Maneatis | |
| 6,741,110 B2 | 5/2004 | Roisen | |
| 6,744,277 B1 | 6/2004 | Chang et al. | |
| 6,744,292 B2 | 6/2004 | Chen et al. | |
| 6,771,114 B2 | 8/2004 | Watarai | |
| 6,829,318 B2 | 12/2004 | Kawahara | |
| 6,853,253 B2 * | 2/2005 | Desortiaux | 331/16 |
| 6,861,916 B2 | 3/2005 | Dally et al. | |
| 6,924,992 B2 | 8/2005 | Gaudin et al. | |
| 6,954,511 B2 | 10/2005 | Tachimori | |
| 7,092,689 B1 | 8/2006 | Boecker et al. | |
| 7,167,037 B2 | 1/2007 | Rodgers et al. | |
| 7,176,733 B2 | 2/2007 | Maerle | |
| 7,382,849 B1 | 6/2008 | Groe et al. | |
| 2002/0041196 A1 | 4/2002 | Demone et al. | |
| 2004/0057546 A1 | 3/2004 | Badets et al. | |
| 2004/0066220 A1 * | 4/2004 | Chen | 327/157 |
| 2004/0085106 A1 * | 5/2004 | Jeong | 327/157 |
| 2005/0068076 A1 * | 3/2005 | Iroaga | 327/158 |
| 2005/0083090 A1 | 4/2005 | Moraveji | |
| 2005/0195003 A1 * | 9/2005 | Soe | 327/157 |
| 2006/0022727 A1 * | 2/2006 | Kim | 327/157 |
| 2007/0018701 A1 * | 1/2007 | Abbasi et al. | 327/157 |
| 2009/0121760 A1 | 5/2009 | Haerle | |

FOREIGN PATENT DOCUMENTS

| | | |
|---|---|---|
| EP | 0 484 059 A2 | 5/1992 |
| EP | 0755120 A1 * | 7/1996 |
| EP | 0755120 A1 | 1/1997 |
| EP | 1 292 033 A1 | 3/2003 |
| EP | 1292032 A1 | 3/2003 |
| KR | 1019990080026 A | 11/1999 |
| KR | 1020010110928 A | 12/2001 |
| KR | 20030051976 A | 6/2003 |
| KR | 20010057036 A | 7/2004 |

OTHER PUBLICATIONS

Duque-Carrillo, J.F. et al., "1-V Rail-to-Rail Operational Amplifiers in Standard CMOS Technology," Jan. 2000, IEEE Journal of Solid-State Circuits, vol. 35(1).

Maneatis, J.G., "Low-Jitter Process-Independent DLL and PLL Based on Self-Biased Techniques," Nov. 1996, IEEE Journal of Solid-State Circuits, vol. 31(11).

Kim, C.H. et al., "A 64-Mbit, 640-Mbyte/s Bidirectional Data Strobed, Double-Data-Rate SDRAM with a 40-mW DLL for a 256-Mbyte Memory System," Nov. 1998, IEEE Journal of Solid-State Circuits, vol. 33(11).

Moon, Y. et al., "An All-Analog Multiphase Delay-Locked Loop Using a Replica Delay Line for Wide-Range Operation and Low-Jitter Performance," Mar. 2000, IEEE Journal of Solid-State Circuits, vol. 35(3).

Larsson, P., "A 2-1600MHz 1.2-2.5V CMOS Clock-Recovery PLL with Feedback Phase-Selection and Averaging Phase-Interpolation for Jitter Reduction," 1999, IEEE Journal of Solid-State Circuits Conference.

Lee, J.-S., et al. "Charge Pump with Perfect Current Matching Characteristics in Phase-Locked Loops," *Electronics Letters, IEE Stevenage, GB*, 36(23):1907-1908 (Nov. 2000).

Supplemental European Search Report issued in European Patent Application No. EP 04802287 and dated Apr. 26, 2007 (2 pages).

International Search Report and Written Opinion for PCT/US2005/045427, mailed Apr. 12, 2006.

International Preliminary Report on Patentability for PCT/US2005/045427, mailed Jun. 21, 2007.

Sedra, A., et al., Microelectronic Circuits, p. 404, Oxford University Press, Inc. New York, 1998.

US 6,642,753, 11/2003, Choi (withdrawn)

* cited by examiner

PHASE-LOCKED LOOP CIRCUITRY USING CHARGE PUMPS WITH CURRENT MIRROR CIRCUITRY

CROSS-REFERENCE TO RELATED APPLICATION

This application claims the priority of U.S. Provisional Patent Application No. 60/635,849 entitled "Systems and Method for Phase Locked Loop Using Charge Pumps" filed on Dec. 13, 2004, which is hereby incorporated by reference.

BACKGROUND

1. Technical Field

The present invention relates generally to phase-locked loop circuitry and more particularly to phase-locked loop circuitry using charge pumps with current mirror circuitry.

2. Description of Related Art

A phase-locked loop (PLL) is an electronic circuit with a voltage- or current-driven oscillator that is adjusted to match in phase (and thus lock on) the frequency of an input signal. In addition, PLLs are used to generate a signal, modulate or demodulate a signal, reconstitute a signal with less noise, and multiply or divide a frequency. PLLs are frequently used in wireless communications, particularly where signals are carried using amplitude modulation (AM), frequency modulation (FM) and phase modulation (PM). PLLs are more commonly used for digital data transmission, but can also be designed for analog information. Examples of applications for PLLs include frequency synthesizers for digitally-tuned radio receivers and transmitters, recovery of small signals that otherwise would be lost in noise lock-in amplifier, recovery of clock timing information from a data stream such as from a disk drive, clock multipliers, and dual-tone multi-frequency (DTMF) decoders, modems, and other tone decoders, for remote control and telecommunications.

FIG. 1 illustrates phase-locked loop (PLL) circuitry 100, according to the prior art. Phase-frequency detector (PFD) circuitry 110 generates an "up" signal 115 and a "down" signal 120 by comparing the phase difference of an input signal 105 to a feedback signal 160. The PFD circuitry 110 outputs the up signal 115 and the down signal 120 depending on whether or not the phase of the feedback signal 160 lags (needs to speed up) or leads (needs to slow down) when compared to the input signal 105. Charge pump circuitry 125 generates current pulses in a charge pump output signal 130 (e.g., to charge capacitors in loop filter circuitry 135) based on the up signal 115 and the down signal 120. The charge pump circuitry 125 generates the current pulses with a minimum pulse width. For example, when the input signal 105 and the feedback signal 160 have equal phase, the current pulses of the charge pump output signal 130 have equal width. With unequal phase, one of the current pulses of the charge pump output signal 130 is lengthened to correct the phase.

The loop filter circuitry 135 filters the charge pump output signal 130 and generates a filtered control signal 140. Voltage controlled oscillator (VCO) circuitry 145 generates an output signal 150 whose. frequency is determined by the voltage of the filtered control signal 140. The PLL circuitry 100 loops the output signal 150 back to the PFD circuitry 110 as the feedback signal 160. Optionally, frequency divider circuitry 155 is placed in the feedback path of the loop to generate the feedback signal 160 and to allow the output signal 150 to be a multiple of the input signal 105.

One problem that arises with the PLL circuitry 100 is that the magnitude of the current pulses that charge the loop filter circuitry 135 (e.g., current pulses of the charge pump output signal 130) is dependent on a variety of voltage sources. Some examples upon which the current pulses depend are power supply voltages and the voltage of the filtered control signal 140. Also, if circuitry in the PLL circuitry 100 is terminated to voltages not equidistant from the voltage of the filtered control signal 140, the current pulses for the charge pump output signal 130 may not have equal magnitude. Having unequal magnitude in the current pulses, either from voltage variations or termination mismatch, results in static phase offsets in the output of the PLLs.

The magnitude of the independent current pulses may also be adjusted to set the desired loop bandwidth. The loop bandwidth is the measure of the ability of the PLL circuitry 100 to lock onto the input signal 105 and to handle jitter. A high loop bandwidth provides a fast lock time and tracks jitter on the input signal 105, passing the jitter through to the output signal 150. A low loop bandwidth filters out the jitter of the input signal 105, but increases the lock time of the PLL circuitry 100. Typically, for a given capacitor in the loop filter circuitry 135, a smaller current for the charge pump output signal 130 produces a lower loop bandwidth and a larger current for the charge pump output signal 130 produces a higher loop bandwidth.

When determining the ideal loop bandwidth, noise performance is an important consideration. In most PLLs, the two primary noise sources that exist are noise from the VCO circuitry 145 (VCO noise) and reference noise. Each source of noise has conflicting loop bandwidth requirements to minimize the effects of the noise. VCO noise is due to thermal and shot noise in the VCO circuitry 145 and affects the output signal 150. VCO noise is usually dominant and is reduced by increasing the loop bandwidth (i.e., increasing the current output from the charge pump circuitry 125) which allows the PLL circuitry 100 to track low frequency noise (i.e., noise below the loop bandwidth) and compensate for the effect of the low frequency noise on the output signal 150. Typically, VCO noise drops off rapidly at higher frequencies, so the noise remaining above the loop bandwidth generally has little effect on the output signal 150.

Reference noise has multiple contributors such as jitter on the input signal 105, thermal noise in the charge pump circuitry 125, and supply noise associated with the voltage of the filtered control signal 140. In integer PLLs with a clean input signal 105 (i.e., no jitter), increasing the loop bandwidth reduces the effect of the thermal noise in the charge pump circuitry 125, which reduces reference noise. However, if the input signal 105 is noisy, a high loop bandwidth allows more of the reference noise to pass through to the output signal 150. Similarly, in certain types of PLLs, known as delta-sigma PLLs, the value of the feedback divider circuitry 155 may be varied dynamically, which produces noise similar to reference noise on a noisy input signal 105. The reference noise can dominate the VCO noise and therefore the minimum possible loop bandwidth is desired rather than increasing the loop bandwidth.

Two exemplary ways to minimize the loop bandwidth are to increase the size of capacitors used in the loop filter circuitry 135 and to decrease the magnitude of the current of the charge pump output signal 130. Because area is a major concern in many designs and large capacitors increase the area requirements, decreasing the magnitude of the current is usually chosen. To achieve loop bandwidths on the order of 100 kHz using integrated capacitors of a reasonable size, currents with magnitudes ranging down to 10 s of nanoamps may be necessary. Reducing the magnitude of the current may reduce noise (e.g., reference noise), however, many other challenges arise when attempting to generate very low currents, especially in deep submicron technologies.

In particular, with nanoampere currents, such as those used in the delta-sigma PLLs, current mismatch due to the Early effect (i.e., reduction of the width of the base in bipolar transistor due to the widening of the base-collector junction with increasing base-collector voltage) can be significant depending on the value of the voltage for the filtered control signal. Moreover, the magnitude of device leakage in deep submicron technologies is often significantly larger than the actual signals being generated. Any mismatch between the currents in the up signal 115 and the down signal 120 caused by the device leakage results in the static phase offset between the input signal 105 and the output signal 160. Additionally, the mismatch generally requires one of the up signal 115 and the down signal 120 to be "on" for more than the minimum required time which allows more noise to be injected into the loop.

SUMMARY OF THE INVENTION

The invention addresses the above problems by providing a system and method for performing phase-locked loop. The system includes phase frequency detector circuitry, charge pump circuitry having a first current mirror circuitry and a second current mirror circuitry, loop filter circuitry, and voltage controlled oscillator circuitry. The phase frequency detector circuitry generates an up signal and a down signal based on the phase difference of an input signal and a feedback signal. The charge pump circuitry includes the first current mirror circuitry and the second mirror circuitry and generates a charge pump output signal based on the up and down signals. The loop filter circuitry generates a filtered control signal based on the charge pump output signal. The voltage controlled oscillator circuitry generates the feedback signal with a repeating waveform based on the filtered control signal. Advantageously, the system and method provide accurate current pulses to reduce static phase offset and provide a good resolution for tracking the input signal in the feedback signal. Another advantage is that the system and method provide good resolution for tracking the input signal at low power in submicron technologies.

To provide the accurate current pulses, the second current mirror circuitry of the charge pump circuitry may mirror a reference current of the first current mirror circuitry. Additionally, the charge pump circuitry may generate current pulses of substantially equal magnitude. Further, the system may include biasing circuitry that generates a voltage bias in the second current mirror circuitry. The biasing circuitry may comprise an operational amplifier. The biasing circuitry may generate the voltage bias based on a voltage for the first current mirror circuitry and a voltage for the charge pump output signal. Generating the voltage bias can provide current pulses of substantially equal magnitude at low currents.

In some embodiments, one of the first current mirror circuitry and the second current mirror circuitry further comprises current mirror output circuitry having a plurality of current outputs of differing magnitude. The plurality of current outputs may provide one or more loop bandwidths. Programmable loop bandwidth circuitry may select one of the plurality of current outputs to determine the loop bandwidth. Further, leakage compensation circuitry may reduce off-state leakage from the current mirror output circuitry to the charge pump output signal. The leakage compensation circuitry may also include a third current mirror circuitry configured to receive the off-state leakage and transfer the off-state leakage to the current mirror output circuitry.

In further embodiments, current pulse circuitry generates up current pulses and down current pulses in the charge pump output signal from the first current mirror circuitry and the second current mirror circuitry, respectively. Pulse leakage isolation circuitry may reduce off-state leakage from the pulse circuitry to the charge pump output signal. In one aspect, reducing the off-state leakage comprises producing a first voltage across the pulse circuitry substantially equal to a second voltage for the charge pump output signal. Additionally, charge compensation circuitry may reduce charge transfer from the pulse circuitry to the charge pump output signal.

In some embodiments, power-on circuitry generates a turn-on voltage for the filtered control signal. Power-on leakage isolation circuitry may reduce off-state leakage from the power-on circuitry to the filtered control signal. Advantageously, the power-on circuitry is large enough to start the system with little or no leakage during normal operation.

DETAILED DESCRIPTION OF THE INVENTION

The embodiments discussed herein are illustrative of one example of the present invention. As these embodiments of the present invention are described with reference to illustrations, various modifications or adaptations of the methods and/or specific structures described may become apparent to those skilled in the art. All such modifications, adaptations, or variations that rely upon the teachings of the present invention, and through which these teachings have advanced the art, are considered to be within the scope of the present invention. Hence, these descriptions and drawings should not be considered in a limiting sense, as it is understood that the present invention is in no way limited to only the embodiments illustrated.

A circuit implementation of the principles disclosed may be implemented using PMOS transistors alone, NMOS transistors alone, parallel combinations of PMOS and NMOS transistors, or other types of transistors. In some embodiments, the parallel combinations may be preferred to result in improved charge compensation. Additionally, current mirror circuitry may have multiple possible transistor implementations.

Figure 1:
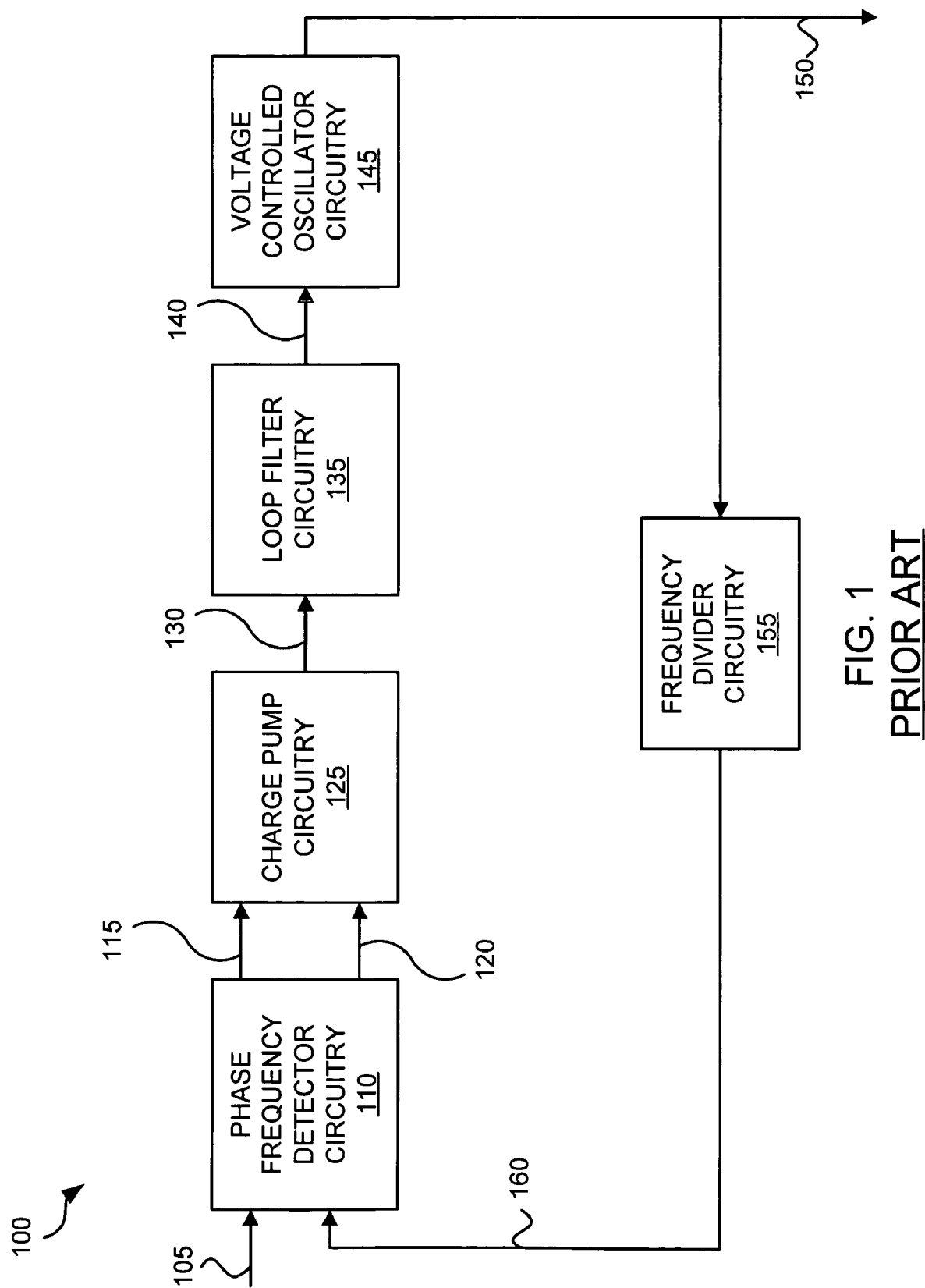
FIG. 1 illustrates phase-locked loop circuitry according to the prior art.
Figure 2:
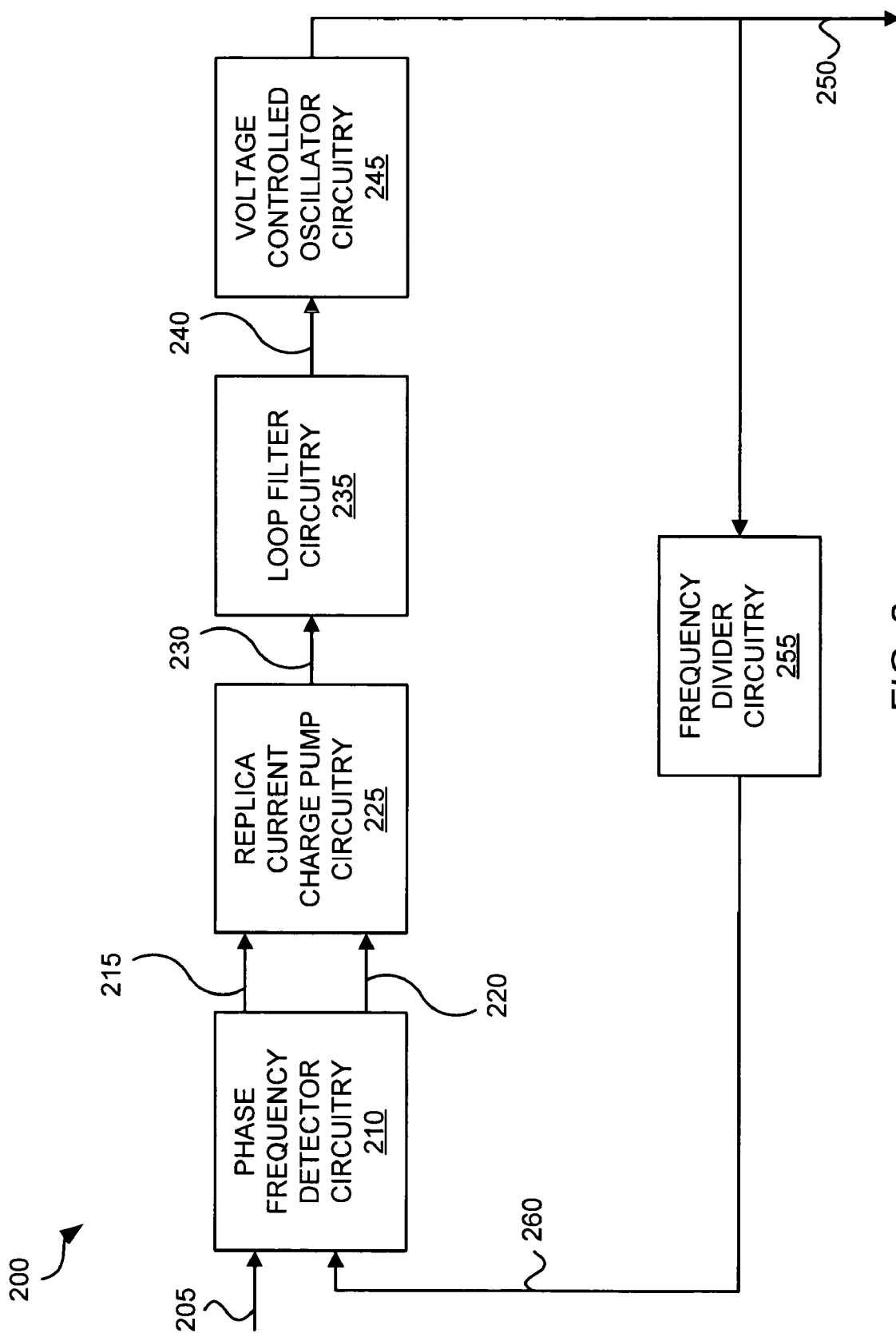
FIG. 2 illustrates phase-locked loop circuitry with current replica charge pump circuitry in an exemplary implementation of the invention.

FIG. 2 illustrates phase-locked loop (PLL) circuitry 200 with replica current charge pump circuitry 225 in an exemplary implementation of the invention. The PLL circuitry 200 includes phase-frequency detector (PFD) circuitry 210, the replica current charge pump circuitry 225, loop filter circuitry 235, voltage controlled oscillator (VCO) circuitry 245, and frequency divider circuitry 255. The PFD circuitry 210 receives an input signal 205 and a feedback signal 260 and generates an "up" signal 215 and a "down" signal 220. The replica current charge pump circuitry 225 receives the up signal 215 and the down signal 220 and generates a charge pump output signal 230. The loop filter circuitry 235 receives the charge pump output signal 230 and generates a filtered control signal 240. The VCO circuitry 245 receives the filtered control signal 240 and generates an output signal 250. The frequency divider circuitry 255 receives the output signal 250 and generates the feedback signal 260.

The PFD circuitry 210 comprises any device, component, or circuitry configured to generate the up signal 215 and the down signal 220 based on the phase difference of the input signal 205 and the feedback signal 260. The replica current charge pump circuitry 225 comprises any device, component, or circuitry configured to replicate a reference current in first current mirror circuitry and second current mirror circuitry and generate the charge pump output signal 230 based on the up signal 215 and the down signal 220. One example of the replica current charge pump circuitry 225 is described below in FIG. 3.

The loop filter circuitry 235 comprises any device, component, or circuitry configured to filter the charge pump output signal 230 and generate a filtered control signal 240. The VCO circuitry 245 comprises any device, component, or circuitry configured to generate the output signal 250 with a repeating waveform based on the voltage of the filtered control signal 240. The frequency divider circuitry 255 comprises any device, component, or circuitry configured to multiply and/or divide the frequency of the output signal 250 and generate the feedback signal 260.

Figure 3:
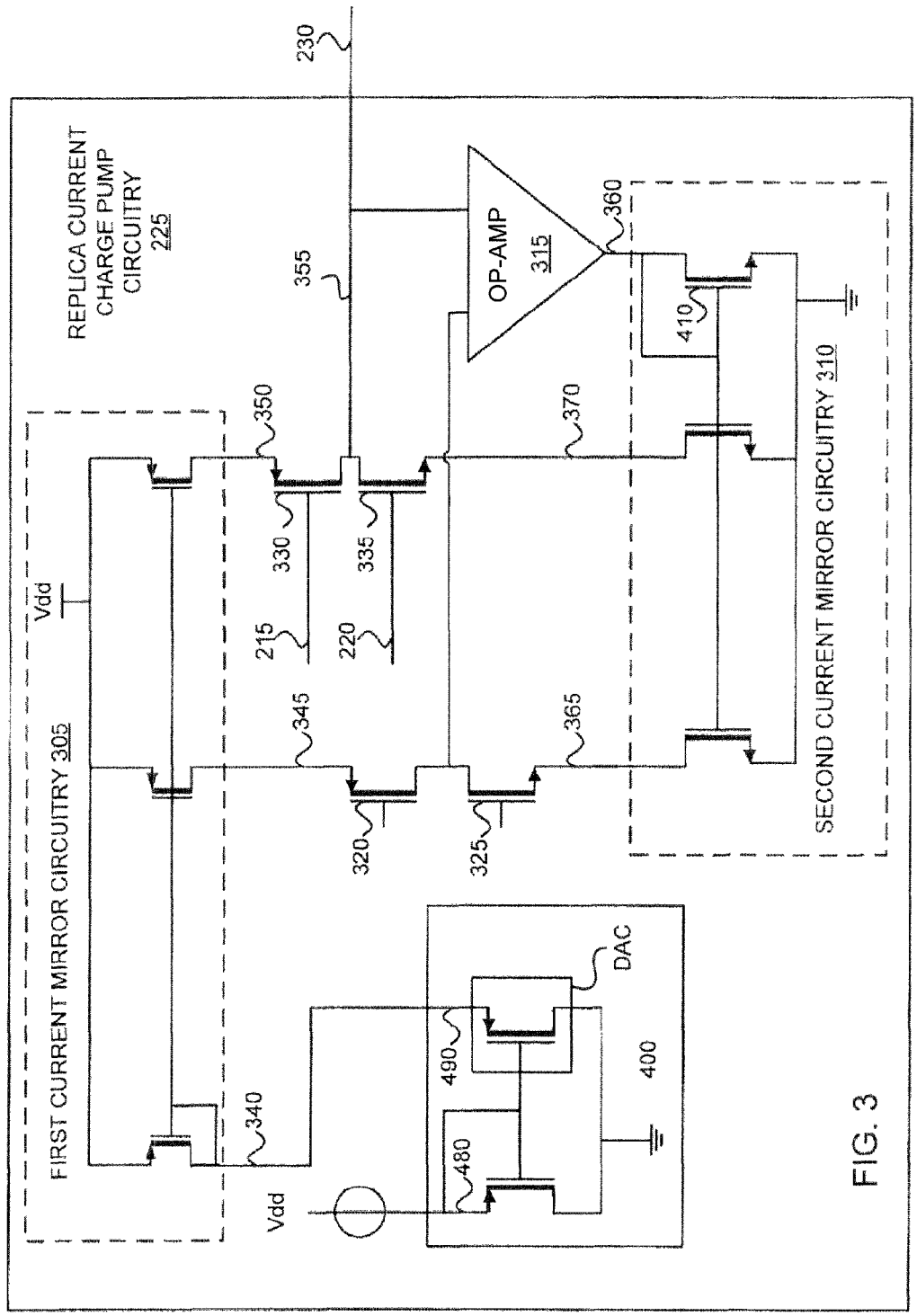
FIG. 3 illustrates the current replica charge pump circuitry in an exemplary implementation of the invention.

FIG. 3 illustrates the replica current charge pump circuitry 225 in an exemplary implementation of the invention. The replica current charge pump circuitry 225 includes first current mirror circuitry 305 preferably employing PMOS transistors, second current mirror circuitry 310 preferably employing NMOS transistors, biasing circuitry 315, a PMOS replica switch 320, a NMOS replica switch 325, a PMOS up signal switch 330, and a NMOS down signal switch 335. In alternative embodiments, replica switches and up/down signal switches can be implemented entirely with all NMOS or all PMOS transistors.

The first current mirror circuitry 305 receives a reference current 340 and has a first output 345 linked to the replica switch 320. The first current mirror circuitry 305 also has a second output 350 linked to the up signal switch 330. The second current mirror circuitry 310 is linked to the output of op-amp (or operational transconductance amplifier) 315 via an input 360 and has a first output 365 linked to the replica switch 325. The second current mirror circuitry 310 also has a second output 370 linked to the down signal switch 335. The replica switch 320 is linked to the replica switch 325. The up signal switch 330 is linked to the down signal switch 335. Inputs of op-amp 315 are linked to the connection between the replica switches 320 and 325, and to replica current charge pump output 230. The gates of the replica switches 320 and 325 are enabled (i.e., the switch is always closed) by connecting the gate of PMOS replica switch to Vdd and the gate of NMOS replica switch to ground. The up signal 215 (FIG. 2) is linked to the gate of the up signal switch 330. The down signal 220 (FIG. 2) is linked to the gate of the down signal switch 335. The up signal switch 330 and the down signal switch generate the charge pump output signal 230 (FIG. 2) on line 355.

The first current mirror circuitry 305 comprises any device, component, or circuitry configured to replicate a reference current on one or more current mirror outputs. For example, the first current mirror circuitry 305 replicates the reference current 340 on the output 345 and the output 350. The second current mirror circuitry 310 comprises any device, component, or circuitry configured to provide one or more current mirror outputs controlled by an input. For example, the second current mirror 310 provides matched currents on output 365 and output 370 controlled by input 360. The op-amp 315 comprises any device, component, or circuitry configured to generate a voltage output based on a difference between two input voltages.

During operation, the op-amp 315 forces the first output 365 of the second current mirror circuitry 310 to the same current provided by output 345 of the first current mirror circuitry 305. The voltage at the connection between replica switches 320 and 325 is also forced by op-amp 315 to have an identical and/or similar voltage bias condition as the charge pump output signal 230 on the line 355. Since outputs 365 and 370 of the second current mirror 310 are matched, and outputs 345 and 350 of the first current mirror 305 are matched, the second output 370 of the second current mirror circuitry 310, if enabled by the down signal switch 335, will have an identical current as the second output 350 of the first current mirror circuitry 305, if enabled by the up signal switch 330, for any given voltage on replica current charge pump output 230.

Therefore, the replica current charge pump circuitry 225 provides equal magnitude current pulses for the charge pump output signal 230 when enabled by the up signal 215 and the down signal 220. The voltage bias provided by op-amp 315 removes the effect of the voltage of the charge pump output signal 230 on the accuracy of the first current mirror circuitry 305 and the second current mirror circuitry 310 to generate the current pulses. The voltage bias provided by op-amp 315 further allows the first current mirror circuitry 305 and the second current mirror circuitry 310 to accurately replicate the reference current 340 at low power thereby providing the current pulses of equal magnitude at low currents. Accurately producing current pulses of equal magnitude prevents noise from propagating from the replica current charge pump circuitry 225 to the loop filter 235, and eventually to the VCO 245 where the noise causes offsets in the output signal 250. Additionally, replicating the current pulses with equal magnitude reduces mismatch. Furthermore, any mismatch between current pulses for the up signal 215 and the down signal 220 is now determined by the basic mismatch between the first current mirror circuitry 305 and the second current mirror circuitry 310 under essentially identical voltage bias conditions.

In some embodiments, a large current in the charge pump output signal 230 is required relative to the magnitude of the reference current 340. For example, large divider values in the feedback divider circuitry 255 (FIG. 2) require a relatively large current. One or more currents of differing magnitude, including a relatively large current, may be provided as the reference current 340 through a programmable current mirror digital to analog converter coupled to one of the first current mirror circuitry 305 and the second current mirror circuitry 310.

Figure 4:
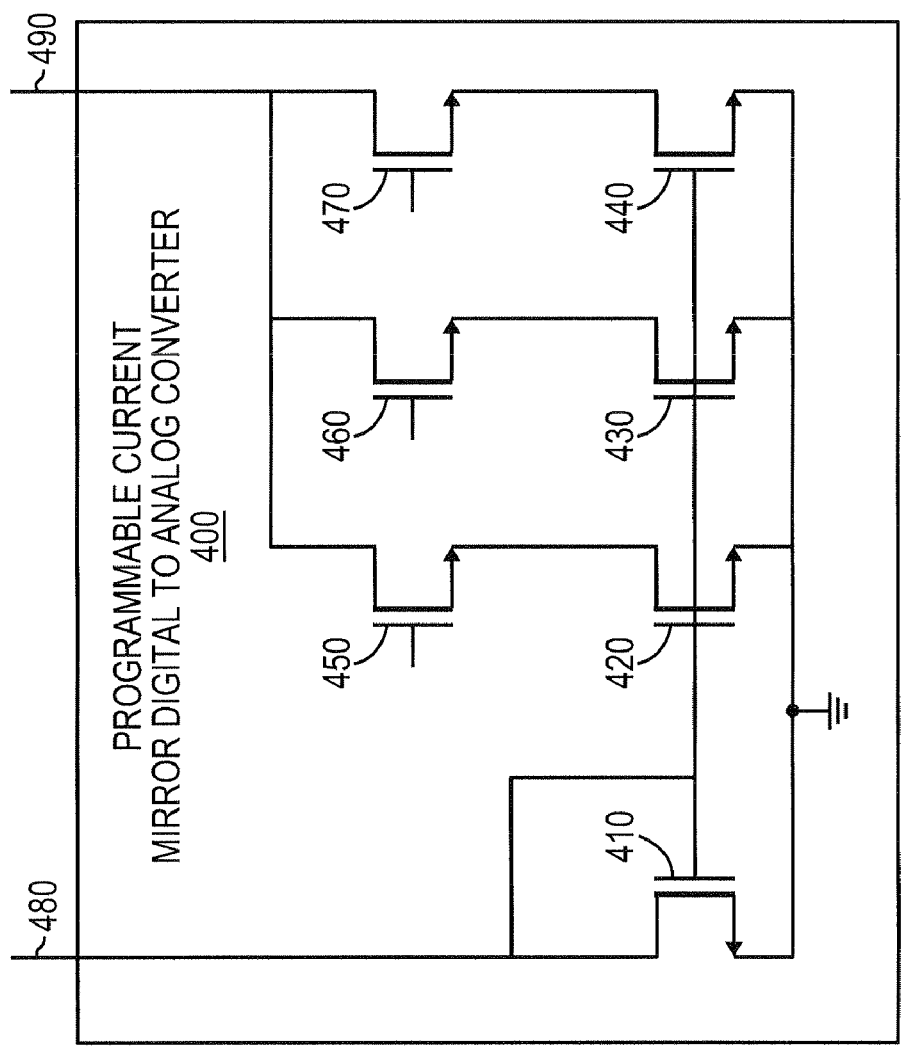
FIG. 4 illustrates a programmable current mirror digital to analog converter (PCMDAC) in an exemplary implementation of the invention.

FIG. 4 illustrates a programmable current mirror digital to analog converter (PCMDAC) 400 in an exemplary implementation of the invention using NMOS transistors. The PCMDAC 400 includes current mirror input 410, converter outputs 420, 430, and 440, and converter selectors 450, 460, and 470. A reference current 480 is linked to source follower 410.

Current mirror input 410 is linked to the converter outputs 420, 430, and 440. The reference current 480 is also linked to the gates of the converter outputs 420, 430, and 440. The converter output 420 is linked to the converter selector 450. The converter output 430 is linked to the converter selector 460. The converter output 440 is linked to the converter selector 470. Each of the converter selectors 450, 460 and 470 are linked to form a converter output signal 490.

The converter outputs 420, 430, and 440 comprise any device, component, or circuitry configured to provide currents of differing magnitude from the reference current 480. In one example, the PCMDAC 400 receives the reference current 480 from a reference current source and provides converter output 490 to reference current input 340 of replica charge pump circuit 225. The digital input to the converter selectors 450, 460 and 470 is a binary value M where M=[magnitude of converter output $420 \times 2^0$]+[magnitude of converter output $430 \times 2^1$]+[magnitude of converter output $440 \times 2^2$]. The converter outputs 420, 430, and 440 are binary weighted multiples of the reference current 480 in series with the converter selectors 450, 460, and 470, respectively. Therefore, the converter output signal 490 is a multiple of M times the reference current 480. This principle may be extended to large numbers of bits with the accuracy of the PCMDAC 400 limited by the matching of the individual converter outputs and converter selectors which have similar bias conditions.

Current mirror input 410 in the PCMDAC 400 may be a single unit (N=1), such that the converter output signal 490 equals M times the reference current 480. Current mirror input 410 may provide a larger unit such that the converter output signal 490 equals M/N times the reference current 490. In some embodiments, generating arbitrary functions are possible for the converter output signal 490 where the converter outputs 420, 430, and 440 are not binary weighted.

Used in the replica current charge pump circuitry 225 (FIG. 3), the reference current 480 may be derived from a current bias reference generation circuit). The first current mirror circuitry 305 coupled to the PCMDAC 400 determines the loop bandwidth of the PLL circuitry 200. The converter output signal 490 is used as the reference current input 340 for the first current mirror 305. The second current mirror circuitry 310 also mirrors the current provided by converter output signal 490 through the action of op-amp 315. Several PCMDACs may be concatenated to realize a wider range of programmability.

In alternative embodiments of the PLL circuitry 200 having more than one VCO (with different voltages for the filtered control signal 240), an additional PCMDAC 400 may be used. The converter output 490 of the additional PCMDAC 400 is controlled by the logical values selecting the VCO in use. As a result, the additional PCMDAC 400 can provide a constant loop bandwidth, regardless of the individual loop parameters. The concatenation of several PCMDACs further enables the construction of programmable PLL circuitry where the loop bandwidth is thus independently programmable. The programmable PLL circuitry facilitates usage in other circuits where a constant loop bandwidth is desirable.

Moreover, in the programmable PLL circuitry, a wide range of loop bandwidth settings are desirable in combination with a wide range of settings for the feedback divider circuitry 255 (FIG. 2) where a large range of currents may be required to be provided by the replica current charge pump circuitry 225. When implementing multiple PCMDACs to provide the large range of currents in the replica current charge pump circuitry 225, noise typically accumulates with each additional PCMDAC. The magnitude of the noise typically decreases with increasing current. Therefore, the largest possible currents may be used within the constraints of current mirror headroom and power budget.

To minimize noise and mismatch effects, the PCMDAC 400 is preferably dimensioned with the largest transistor drive voltages allowed by the minimum operational supply voltage desired. The largest transistor drive voltage therefore results in a high voltage on current mirror input 410 when large output currents are programmed. The PCMDAC 400 may also work with currents down to the nanoampere range for other loop bandwidth, VCO voltage settings, and frequency divider settings. In some embodiments, the converter selectors 450, 460, and 470 provide a very low resistance to allow sufficient voltage headroom for the wide range of currents.

In deep submicron technologies, however, low on-resistance corresponds to high leakage in the off-state. The leakage through the converter selectors 450, 460, and 470 for the converter outputs 420, 430, and 440 having a higher magnitude current may exceed the desired output signal for the converter output signal 490 (e.g., for a 7 bit DAC, the leakage may be 1-2 orders of magnitude larger than the signal). The leakage may also increase with each additional bit (and therefore each higher magnitude converter output) in the PCMDAC 400.

Figure 5:
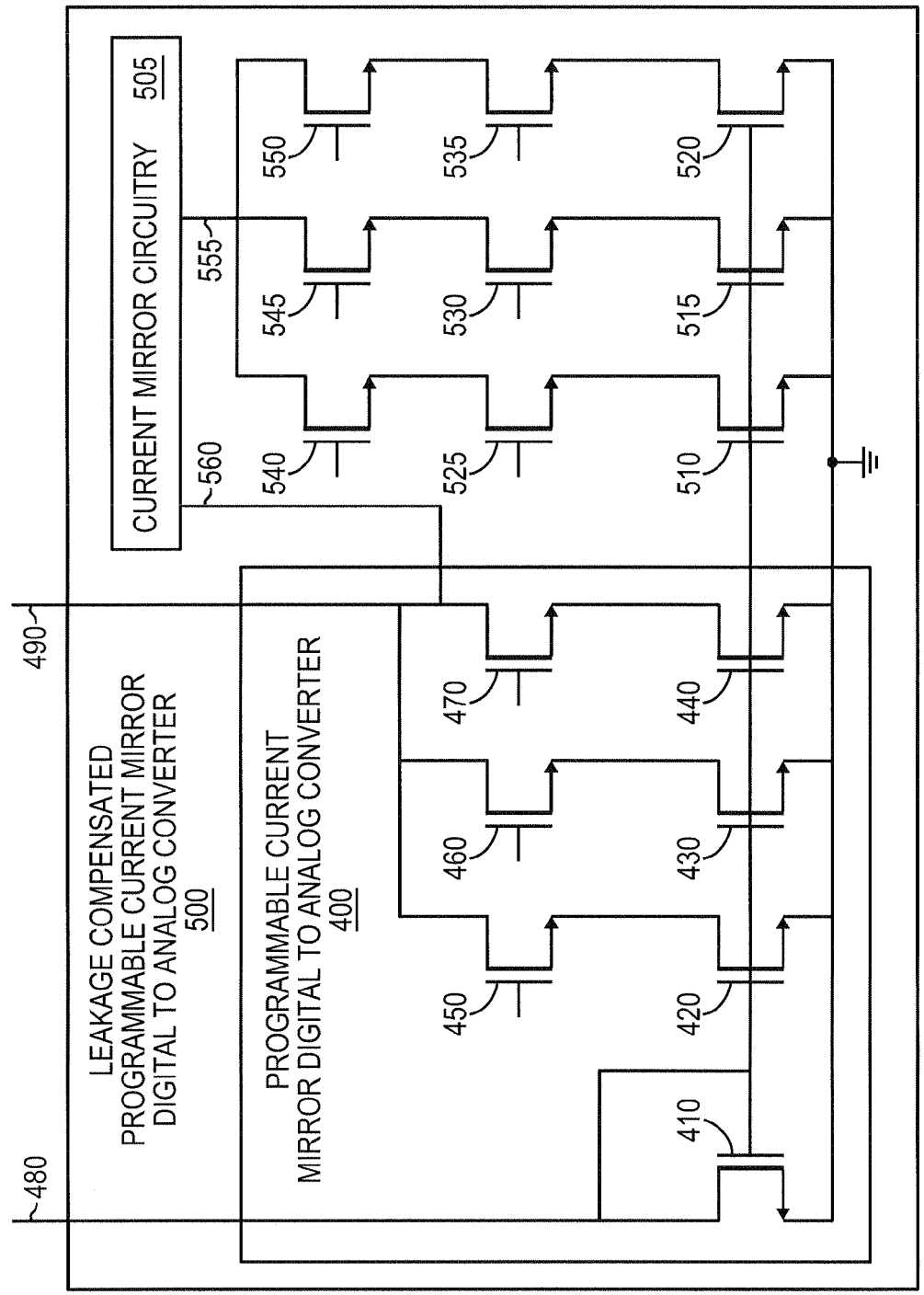
FIG. 5 illustrates a leakage compensated PCMDAC in an exemplary implementation of the invention.

FIG. 5 illustrates a leakage compensated PCMDAC 500 in an exemplary implementation of the invention using NMOS transistors. The leakage compensated PCMDAC 500 includes the PCMDAC 400 (FIG. 4), current mirror circuitry 505, converter outputs 510, 515, and 520, off-state switches 525, 530, and 535, and converter selectors 540, 545, and 555. The converter outputs 510, 515, and 520 are linked to current mirror input 410 in the PCMDAC 400. The reference current 480 is linked to the gate of the converter outputs 510, 515, and 520.

The converter output 510 is linked by the off-state switch 525 to the converter selector 540. The converter output 515 is linked by the off-state switch 530 to the converter selector 545. The converter output 520 is linked by the off-state switch 535 to the converter selector 550. The converter selectors 540, 545, and 550 are linked to the current mirror circuitry 505 via line 555. The current mirror circuitry 505 is linked to the PCMDAC 400 at the converter output 490.

Leakage currents in the PCMDAC 400 are replicated in the leakage compensated PCMDAC 500 which is nearly identical to the PCMDAC 400. In the leakage compensated PCMDAC 500, however, the converter outputs 510, 515, and 520 are always off or disabled. The off-state switches 525, 530, and 535 (i.e., which may be "low-leakage" NMOS transistors with gate terminals connected to ground) are placed in series with each converter output 510, 515, and 520. The converter selectors 540, 545, and 550 are only enabled when the corresponding converter selectors 450, 460, and 470, respectively in the PCMDAC 400 are disabled. For example, when converter output 420 is disabled by the converter selector 450, the converter selector 540 is enabled. Every inactive branch (converter output) in the PCMDAC 400 corresponds to an active branch in the leakage compensated PCMDAC 500 and identical leakage currents flow through both.

In some embodiments, high on-resistance in the converter selectors 540, 545, and 550 is acceptable because the currents through the converter selectors 540, 545, and 550 are so small (only leakage) that the voltage drop across the converter selectors 540, 545, and 550 is negligible even with a relatively high resistance. Additionally, the current mirror circuitry 505, used to mirror the leakage compensation current, is able to operate with low supply voltages. The leakage current can be mirrored and then fed back into the PCMDAC 400 leaving only the intended signal on the converter output 490. One advantage of the leakage compensated PCMDAC 500 is that the topology allows the use of short (low on-resistance) converter selector devices, enabling efficient layout and a smaller silicon area than would otherwise be possible.

In another aspect of reducing leakage in the replica current charge pump 225 (FIG. 2), when the PLL circuitry 200 (FIG. 2) is powered on, the filtered control voltage 240 is often at ground. At the ground voltage, the VCO 245 may fail to oscillate. The power-on ground voltage may potentially prevent the PLL circuitry 200 from ever reaching a locked state.

Figure 6:
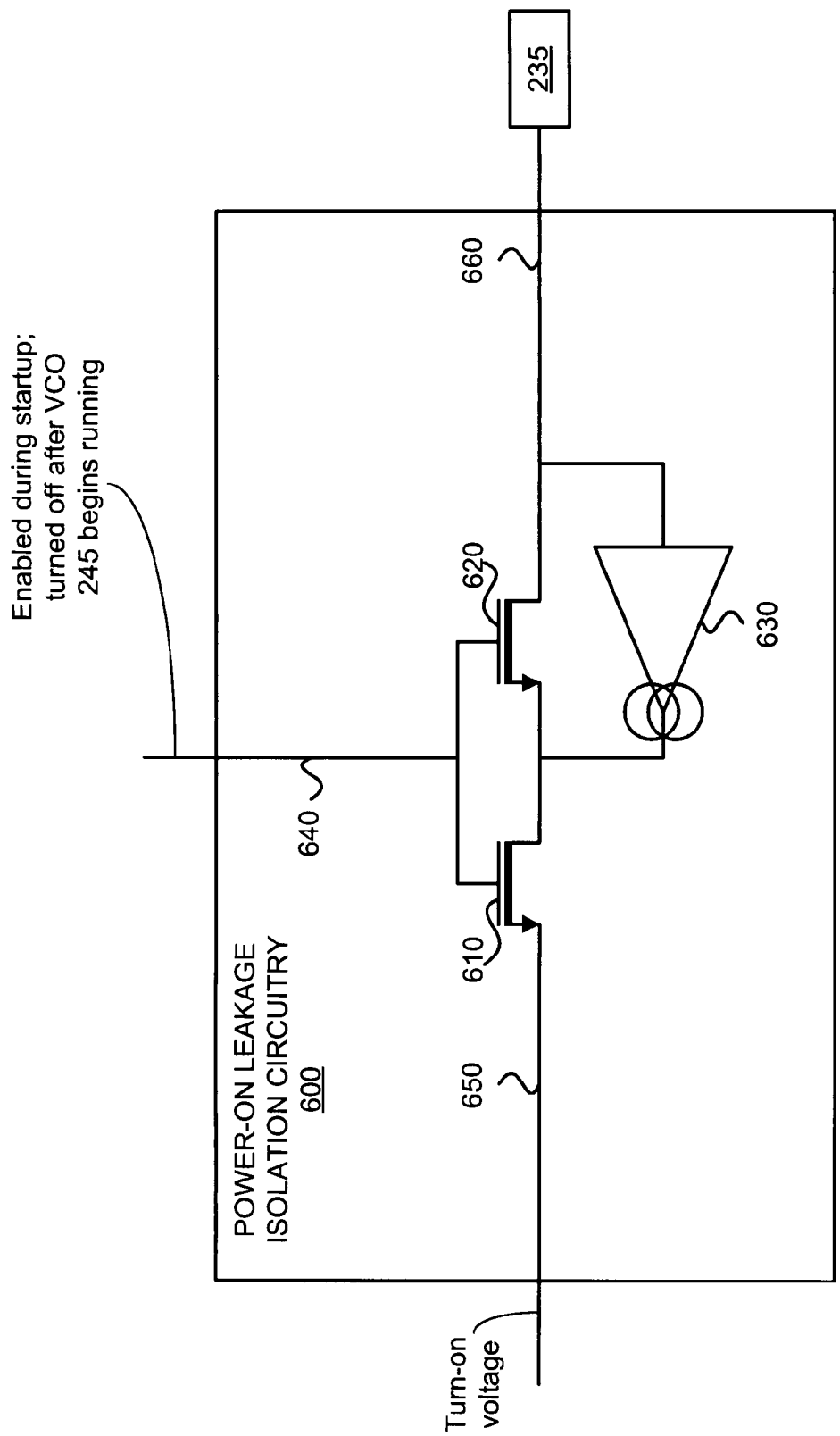
FIG. 6 illustrates power-on leakage isolation circuitry in an exemplary implementation of the invention.

FIG. 6 illustrates power-on leakage isolation circuitry 600 in an exemplary implementation of the invention. The power-on leakage isolation circuitry 600 includes a first NMOS switch 610, a second NMOS switch 620, and biasing circuitry 630. The gates of the first switch 610 and the second switch 620 are controlled via line 640. The first switch 610 receives a turn-on voltage via line 650 and is further linked to the second switch 620. The second switch 620 outputs the turn-on voltage to the loop filter 235 (FIG. 2) via the line 660. The biasing circuitry 630 is linked to the output of the second switch 620 (the line 660) and to the connection between the first switch 610 and the second switch 620.

The biasing circuitry 630 comprises any device, component, or circuitry configured as a voltage follower to reduce the potential across another device, component, or circuitry. For example, the biasing circuitry 630 reduces the potential across the second switch 620. One example of the biasing circuitry 630 is an operational amplifier. During startup, both the first switch 610 and the second switch 620 are enabled (e.g., closed) to allow the turn-on voltage on line 660 to drive loop filter 235. Once the voltage of the filtered control signal 240 reaches a level where the VCO 245 begins running, both the first switch 610 and the second switch 620 may be turned off (e.g., opened). Because the potential across the switch 620 is zero, no leakage current will flow through the second switch 620 to the loop filter 235 via the line 660.

In some embodiments, the biasing circuitry 630 is weak and only strong enough to supply the leakage through the second switch 620 during normal operation. In this case, the biasing circuit does not have to be turned off during startup if switch 610 is large enough to over-drive the biasing circuitry 630. An alternative to using weak biasing circuitry 630 is to turn off the biasing circuitry 630 when the first switch 610 and the second switch 620 are closed.

Figure 7:
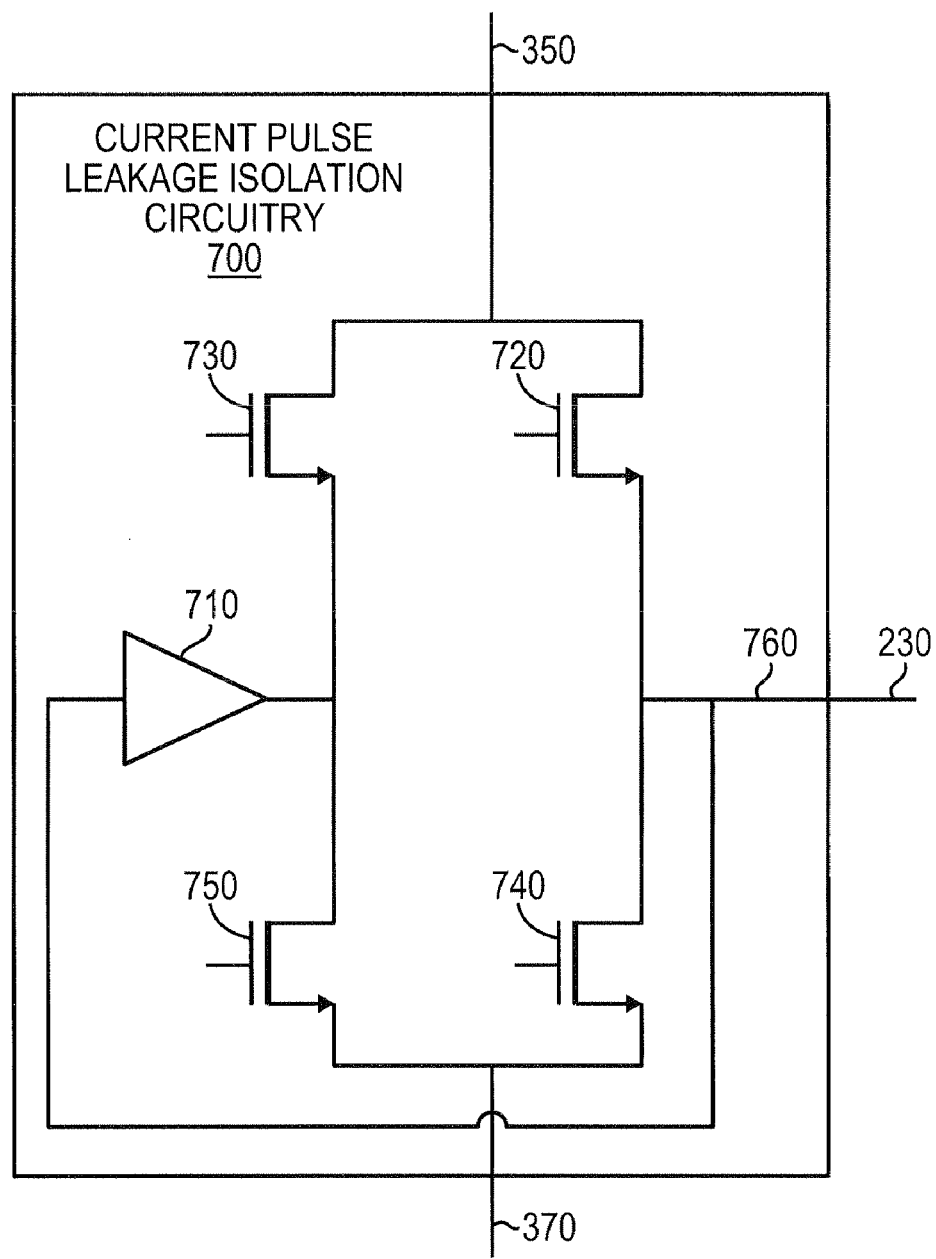
FIG. 7 illustrates current pulse leakage isolation circuitry in an exemplary implementation of the invention.

FIG. 7 illustrates current pulse leakage isolation circuitry 700 in an exemplary implementation of the invention. The current pulse leakage isolation circuitry 700 includes biasing circuitry 710, an up signal switch 720, an inverted up signal switch 730, a down signal switch 740, and an inverted down signal switch 750. The up signal switches 720 and 730 are linked to a current source (e.g., the second output 350 of the first current mirror circuitry 305 of FIG. 3) via the line 350. The up signal switch 720 is linked to the down signal switch 740. The inverted up signal switch 730 is linked to the inverted down signal switch 750. The down signal switches 740 and 750 are linked to a current drain (e.g., the second output 370 of the second current mirror 310 of FIG. 3) via line 370. The input of biasing circuitry 710 is linked to the connection between the up signal switch 720 and the down signal switch 740 and the output of biasing circuitry 710 is linked to the connection between the inverted up signal switch 730 and the inverted down signal switch 750. The up signal switch 720 and the down signal switch 740 generate the charge pump output signal 230 (FIG, 2) via line 760 based on the up signal 215 (FIG. 2) and the down signal 220 (FIG. 2). Although up and down signal switches are shown as NMOS transistors, up signal switches may be implemented with PMOS transistors as shown in FIG. 3.

The largest current and voltage levels, for the PLL circuitry 200 operating with small supply voltages, determine the size of the up and down signal switches 720, 730, 740, and 750. However, with small output currents, the leakage through the up and down signal switches 720, 730, 740, and 750 may result in a leakage current flowing through the up and down signal switches 720, 730, 740, and 750 to the charge pump output signal 230 (and into the loop filter 235). To reduce the leakage current, the biasing circuitry 710 generates a voltage bias equal or close to the voltage of the charge pump output signal 230. Biasing circuitry 710 maybe implemented as an op-amp connected in a unity gain configuration. When the up and down signal switches 720, 730, 740, and 750 are off, the currents from current source outputs 350 and 370 are diverted to the biasing circuitry 710. The biasing circuitry 710 ensures that the voltage across the up and down signal switches 720, 730, 740, and 750 is small. The small voltage reduces the leakage currents through the up and down switches 720, 730, 740, and 750 to the charge pump output signal 230.

Figure 8:
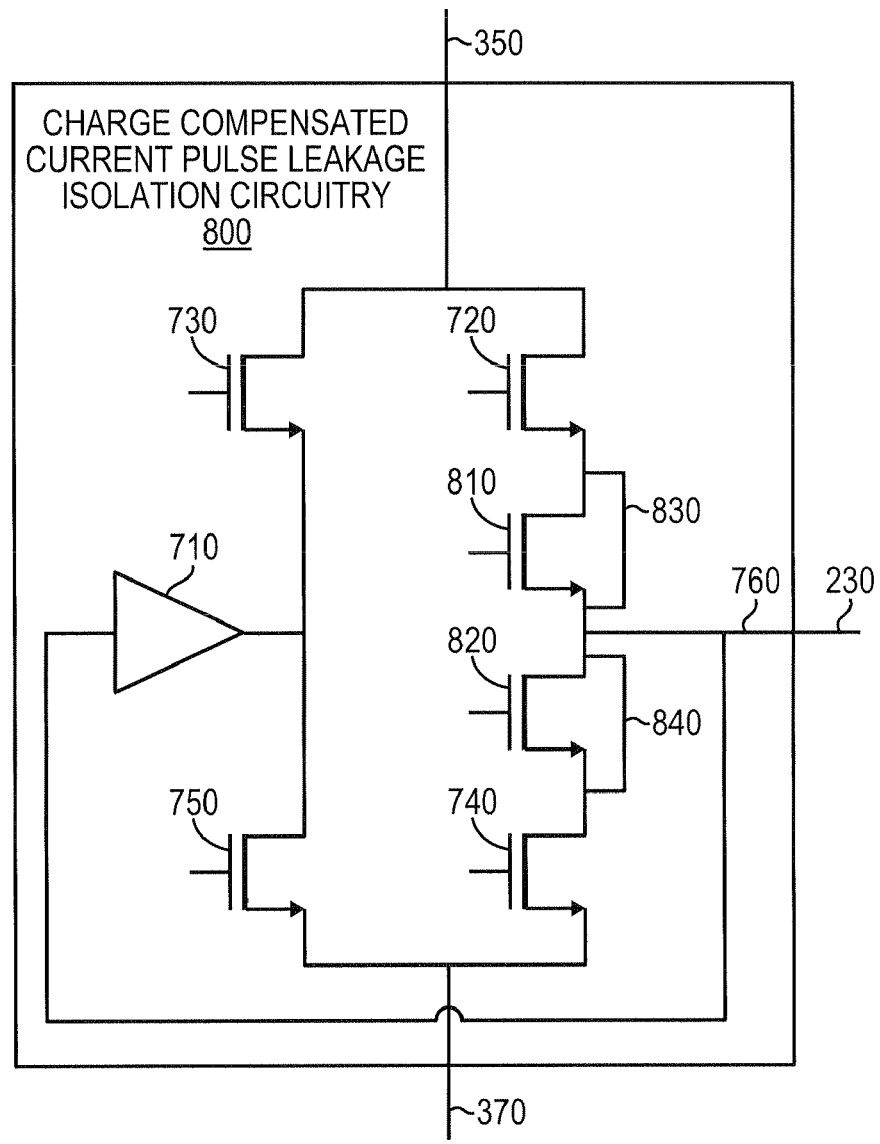
FIG. 8 illustrates charge compensated current pulse leakage isolation circuitry in an exemplary implementation of the invention.

FIG. 8 illustrates charge compensated current pulse leakage isolation circuitry 800 in an exemplary implementation of the invention. The charge compensated current pulse leakage isolation circuitry 800 includes the current pulse leakage isolation circuitry 700 and an additional inverted up signal switch 810 and inverted down signal switch 820. The inverted up signal switch 810 is linked to the up signal switch 720 and the inverted down signal switch 820. The inverted down signal switch 820 is further linked to the down signal switch 740. The source and drain of the inverted up signal switch 810 is linked via line 830. The source and drain of the inverted down signal switch 830 is linked via line 840. Although up and down signal switches are shown as NMOS transistors, up signal switches may be implemented with PMOS transistors.

During operation of the current pulse leakage isolation circuitry 700 (FIG. 7), when the up and down signal switches 720, 730, 740, and 750 are switched, transitions on the gate-source and gate-drain capacitance for the up and down signal switches 720, 730, 740, and 750 may result in a small amount of charge being transferred from the control signals (e.g., the up signal 215 and the down signal 220) for the up and down signal switches 720, 730, 740, and 750 to the charge pump output signal 230 on the line 760. The charge compensated current pulse leakage isolation circuitry 800 reduces charge transfer by coupling opposite amounts of charge through inverted up and down signal switches 810 and 820 to the charge pump output signal 230 on the line 760. In some embodiments, the inverted up and down signal switches 810 and 820 have sizes adjusted to compensate charge transfer at the operational voltage of the VCO 245 (FIG. 2).

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A phase-locked loop system comprising:
   phase frequency detector circuitry configured to generate an up signal and a down signal based on a phase difference between an input signal and a feedback signal;
   charge pump circuitry including:
   a first current mirror circuitry,
   a second current mirror circuitry, programmable current mirror circuitry configured to receive a reference current and a digital signal and to output an adjusted reference current to the first current mirror circuitry based on the reference current and the digital signal; and leakage compensation circuitry configured to mirror a leakage current in the programmable current mirror circuitry and to cancel the leakage current appearing at the output of the programmable current mirror, the charge pump circuitry configured to generate a charge pump output signal based on the up signal and the down signal;

loop filter circuitry configured to generate a filtered control signal based on the charge pump output signal; and voltage controlled oscillator circuitry configured to generate the feedback signal based on the filtered control signal.

2. The phase-locked loop system of claim 1 wherein the first current mirror circuitry is configured to mirror a reference current and the second current mirror circuitry is configured to mirror the mirrored reference current of the first current mirror circuitry.

3. The phase-locked loop system of claim 1 wherein the charge pump output signal comprises current pulses of substantially equal magnitude.

4. The phase-locked loop system of claim 1, the charge pump circuitry further comprising biasing circuitry configured to generate a voltage bias in the second current mirror circuitry.

5. The phase-locked loop system of claim 4 wherein the biasing circuitry is configured to generate the voltage bias based on a voltage for the first current mirror circuitry and a voltage for the charge pump output signal.

6. The phase-locked loop system of claim 1, wherein the leakage compensation circuitry is further configured to reduce off-state leakage to the charge pump output signal.

7. The phase-locked loop system of claim 1, the charge pump circuitry further comprising charge compensation circuitry configured to reduce charge transfer to the charge pump circuitry.

8. The phase-locked loop system of claim 1, further comprising power-on circuitry configured to generate a turn-on voltage for the filtered control signal when the phase-locked loop is powered on and to not generate the turn-on voltage when the voltage controlled oscillator circuitry generates the feedback signal.

9. The phase-locked loop system of claim 1 wherein the first current mirror circuitry comprises a leakage compensated programmable current mirror digital to analog converter.

10. The phase-locked loop of claim 1 further comprising programmable current mirror circuitry configured to receive a reference current from the first current mirror circuitry and a digital signal and to output an adjusted current based on the reference current and the digital signal.

11. The phase-locked loop system of claim 1 wherein the feedback signal comprises a repeating waveform.

12. A method for providing a phase-locked loop, the method comprising:

generating an up signal and a down signal based on a phase difference between an input signal and a feedback signal;

generating a charge pump output signal based on the up signal and the down signal in charge pump circuitry including first current mirror circuitry and second current mirror circuitry;

receiving a reference current and a digital signal and outputting an adjusted reference current to the first current mirror circuitry based on the reference current and the digital signal;

mirroring a leakage current in the programmable current mirror circuitry and canceling a leakage current appearing at an output of the programmable current mirror;

generating a filtered control signal based on the charge pump output signal; and generating the feedback signal based on the filtered control signal.

13. The method for providing a phase-locked loop of claim 12, further comprising mirroring a reference current in the first current mirror circuitry; and mirroring in the second current mirror circuitry the mirrored reference current of the first current mirror circuitry.

14. The method for providing a phase-locked loop of claim 12 wherein the charge pump output signal comprises current pulses of substantially equal magnitude.

15. The method for providing a phase-locked loop of claim 12, further comprising generating a voltage bias in the second current mirror circuitry.

16. The method for providing a phase-locked loop of claim 15 wherein generating the voltage bias is based on a voltage for the first current mirror circuitry and a voltage for the charge pump output signal.

17. The method for providing a phase-locked loop of claim 12, further comprising reducing off-state leakage to the charge pump output signal.

18. The method for providing a phase-locked loop of claim 17 wherein reducing the off-state leakage comprises producing a first voltage substantially equal to a second voltage for the charge pump output signal.

19. The method for providing a phase-locked loop of claim 12, further comprising reducing charge transfer to the charge pump output signal.

20. The method for providing a phase-locked loop of claim 12, further comprising generating a turn-on voltage in the filtered control signal at about the time power is applied to the phase-locked loop and then not generating the turn-on voltage when the voltage controlled oscillator circuitry generates the feedback signal.

21. The method for providing a phase-locked loop of claim 12, wherein the first current mirror circuitry comprises a leakage compensated programmable current mirror digital to analog converter.

22. The method for providing a phase-locked loop of claim 12 wherein the feedback signal comprises a repeating waveform.

23. A phase-locked loop system comprising:

phase frequency detector circuitry configured to generate an up signal and a down signal based on a phase difference between an input signal and a feedback signal;

charge pump circuitry including a first current mirror circuitry and a second current mirror circuitry, the charge pump circuitry configured to generate a charge pump output signal based on the up signal and the down signal, and the first current mirror circuitry is leakage compensated;

loop filter circuitry configured to generate a filtered control signal based on the charge pump output signal;

voltage controlled oscillator circuitry configured to generate the feedback signal based on the filtered control signal;

programmable current mirror circuitry configured to receive a reference current from the first current mirror circuitry and a digital signal and to output an adjusted current based on the reference current and the digital signal; and leakage compensation circuitry configured to mirror a leakage current in the programmable current mirror circuitry and to cancel a leakage current appearing at the output of the programmable current mirror.

24. The phase-locked loop system of claim 23 further comprising output circuitry configured to receive a reference current from the second mirror circuitry, the up signal, the down signal, the adjusted current, and the mirrored leakage current, and to generate the charge pump output signal for output from the charge pump.

25. A charge pump for use with a phase-locked loop system including phase difference comparison circuitry, loop filter circuitry, and voltage controlled oscillator circuitry, the phase difference comparison circuitry providing up and down signals to the charge pump, the charge pump comprising:

a first current mirror circuit configured to produce a first mirror current, and comprising a programmable current mirror digital to analog converter configured to receive a reference current and a digital signal and to output an adjusted current based on the reference current and the digital signal, and a leakage compensation circuit configured to generate mirrored leakage current based on leakage current in the programmable current mirror digital to analog converter, generate a compensation current based on the mirrored leakage current and the digital signal, and feed the compensation current back to be combined with the adjusted current for output as the first mirror current;

a second current mirror circuit configured to produce a second mirror current; and a switching circuit configured to receive the up and down signals as input signals thereto, and to generate a charge pump output signal based on the first mirror current, the second mirror current, and the up and down signals for output to the loop filter circuit.

26. A method for providing a phase-locked loop, the method comprising:

generating an up signal and a down signal based on a phase difference between an input signal and a feedback signal;

receiving a digital signal including two or more bits representing a digital number;

generating an adjusted current based on a reference current and the digital signal;

replicating a leakage current component of the reference current;

generating a leakage compensation current based on the replicated leakage current and the digital signal;

combining the adjusted current and the leakage compensation current to generate a first current;

generating a second current;

generating a charge pump output signal based on the first current, the second current, the up signal and the down signal;

generating a filtered control signal based on the charge pump output signal; and generating the feedback signal based on the filtered control signal.

27. The method for providing a phase-locked loop of claim 26, wherein replicating a leakage component of the reference current further comprises providing a plurality of replicated leakage current outputs based on the plurality of current outputs.

28. The method for providing a phase-locked loop of claim 27, wherein generating a leakage compensation current based on the replicated leakage current and the digital signal further comprises selecting one or more of the plurality of replicated leakage current outputs corresponding to the one or more of the selected current outputs, blocking the selected replicated current outputs, unblocking the unselected replicated leakage current outputs, and mirroring the output of unblocked replicated leakage current outputs.

* * * * *